US010008264B2

United States Patent
Ge et al.

(10) Patent No.: US 10,008,264 B2
(45) Date of Patent: Jun. 26, 2018

(54) MEMRISTIVE CROSS-BAR ARRAY FOR DETERMINING A DOT PRODUCT

(71) Applicant: Hewlett Packard Enterprise Development LP, Houston, TX (US)

(72) Inventors: Ning Ge, Palo Alto, CA (US); Jianhua Yang, Palo Alto, CA (US); John Paul Strachan, San Carlos, CA (US); Miao Hu, Palo Alto, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days. days.

(21) Appl. No.: 15/521,542

(22) PCT Filed: Oct. 23, 2014

(86) PCT No.: PCT/US2014/062010
§ 371 (c)(1),
(2) Date: Apr. 24, 2017

(87) PCT Pub. No.: WO2016/064406
PCT Pub. Date: Apr. 28, 2016

(65) Prior Publication Data
US 2017/0316827 A1 Nov. 2, 2017

(51) Int. Cl.
*G11C 13/00* (2006.01)
*G06F 17/16* (2006.01)
*G06F 17/11* (2006.01)

(52) U.S. Cl.
CPC .......... *G11C 13/0069* (2013.01); *G06F 17/11* (2013.01); *G06F 17/16* (2013.01)

(58) Field of Classification Search
CPC .................. G11C 13/0069; G11C 11/1675
(Continued)

(56) References Cited

U.S. PATENT DOCUMENTS 6,256,247 B1   7/2001   Perner et al.
6,501,697 B1   12/2002  Perner et al.
(Continued)

FOREIGN PATENT DOCUMENTS

JP   2005-251381   9/2005
JP   2009-282782   12/2009

OTHER PUBLICATIONS

International Searching Authority, The International Search Report and the Written Opinion, PCT/US2014/062010, dated Jun. 26, 2015, 12 Pages.
(Continued)

*Primary Examiner* — Michael Tran
(74) *Attorney, Agent, or Firm* — Trop, Pruner & Hu, P.C.

(57) ABSTRACT

A method of obtaining a dot product includes applying a number of first voltages to a corresponding number of row lines within a memristive cross-bar array to change the resistive values of a corresponding number of memristors located a junctions between the row lines and a number of column lines. The first voltages define a corresponding number of values within a matrix, respectively. The method further includes applying a number of second voltages to a corresponding number of the row lines within the memristive cross-bar array. The second voltages define a corresponding number of vector values. The method further includes collecting the output currents from the column lines. The collected output currents define the dot product.

19 Claims, 5 Drawing Sheets

(58) Field of Classification Search
USPC .................................................. 365/148, 158
See application file for complete search history.

(56) References Cited

U.S. PATENT DOCUMENTS

| | | | |
|---|---|---|---|
| 7,907,456 B2 | 5/2011 | Houston et al. | |
| 8,421,437 B2* | 4/2013 | Levine | G01N 27/4145 |
| | | | 324/71.5 |
| 9,142,287 B2* | 9/2015 | Ordentlich | G11C 13/0002 |
| 9,323,499 B2* | 4/2016 | Hyde | G06F 7/588 |
| 9,442,854 B2* | 9/2016 | Hyde | G06F 12/0831 |
| 9,588,882 B2* | 3/2017 | Nelson | G06F 12/0238 |
| 9,659,621 B2* | 5/2017 | Seo | G11C 8/12 |
| 2007/0233761 A1 | 10/2007 | Mouttet | |
| 2009/0103379 A1 | 4/2009 | Zhang et al. | |
| 2012/0098566 A1* | 4/2012 | Robinett | H01L 45/04 |
| | | | 326/38 |
| 2013/0028004 A1* | 1/2013 | Snider | G11C 11/406 |
| | | | 365/148 |
| 2014/0006688 A1* | 1/2014 | Yu | G11C 16/10 |
| | | | 711/103 |
| 2014/0081895 A1* | 3/2014 | Coenen | G05B 13/027 |
| | | | 706/25 |
| 2014/0140122 A1 | 5/2014 | Siau | |
| 2014/0143190 A1* | 5/2014 | Padovani | G06N 3/08 |
| | | | 706/15 |
| 2014/0172937 A1* | 6/2014 | Linderman | G06G 7/16 |
| | | | 708/607 |
| 2015/0248248 A1* | 9/2015 | Trezise | G11B 23/049 |
| | | | 711/103 |

OTHER PUBLICATIONS

Smaili, S., et al., Differential Pair Sense Amplifier for a Robust Reading Scheme for Memristor-based Memories, May 19-23, 2013, IEEE, pp. 1676-1679.

* cited by examiner

MEMRISTIVE CROSS-BAR ARRAY FOR DETERMINING A DOT PRODUCT

BACKGROUND

Resistive memory elements often referred to as memristors are devices that may be programmed to different resistive states by applying electrical voltage or currents to the memristors. After programming, the state of the memristors, the memristors may be read. The state of the memristors remains stable over a specified time period long enough to regard the device as non-volatile. A number of memristors may be included within a crossbar array in which a number of column lines intersect with a number of row lines at junctions, and the memristors are coupled to the column lines and row lines at the junctions.

BRIEF DESCRIPTION OF THE DRAWINGS

The accompanying drawings illustrate various examples of the principles described herein and are a part of the specification. The illustrated examples are given merely for illustration, and do not limit the scope of the claims.

Throughout the drawings, identical reference numbers designate similar, but not necessarily identical, elements.

DETAILED DESCRIPTION

Figure 1:
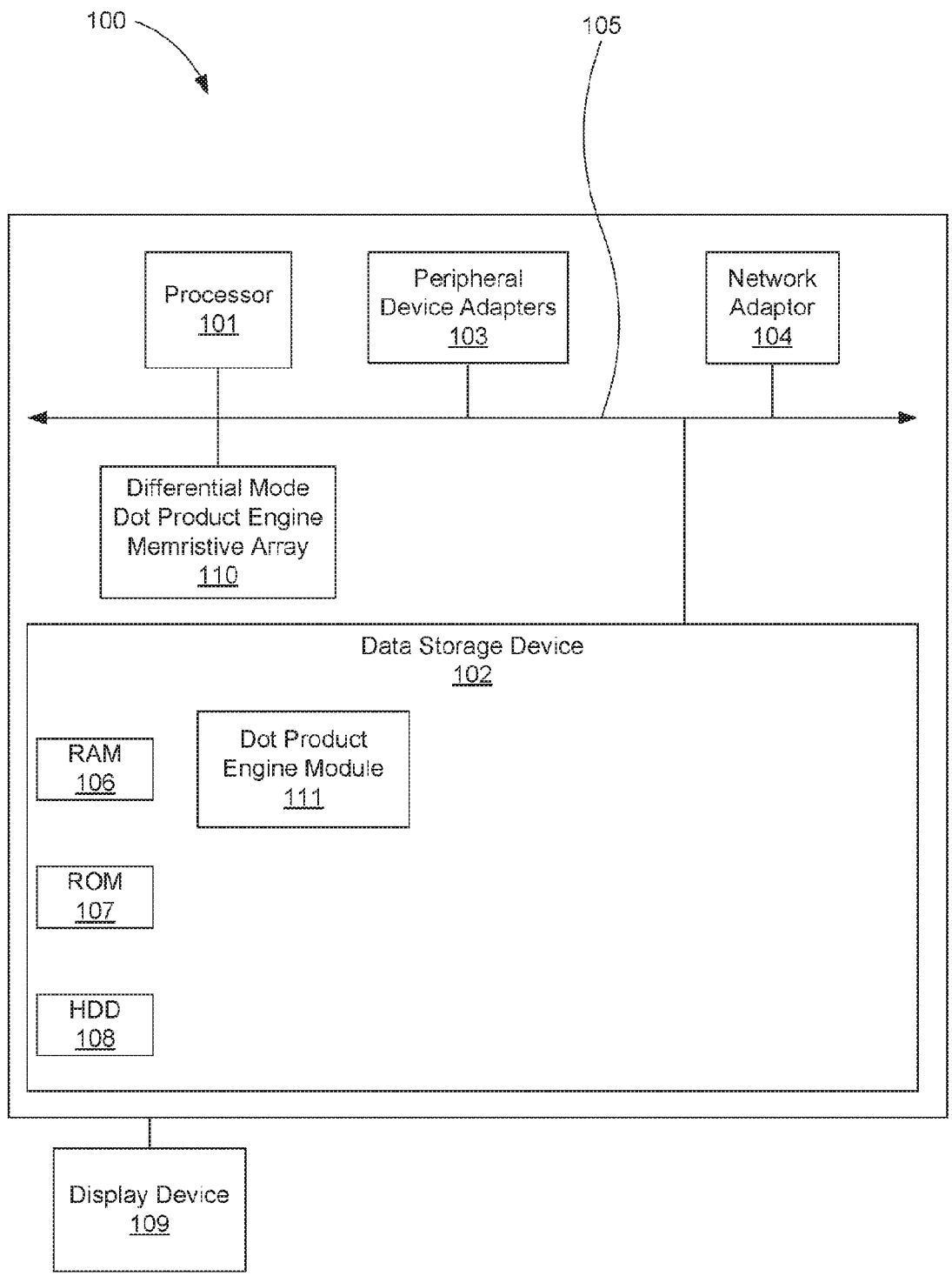
FIG. 1 is a diagram of a computing system for determining a dot product, according to one example of the principles described herein.

Crossbar arrays of memristors may be used in a variety of applications, including non-volatile solid state memory, programmable logic, signal processing, control systems, pattern recognition, and other applications. The present application is directed to a memristive cross-bar array used to determine a dot product of, for example, a number of input matrix values and a number of input vector values. The memristive cross-bar array includes a number of row lines, a number of column lines intersecting the row lines to form a number of junctions, and a number of resistive memory devices coupled between the row lines and the column lines at the junctions. A number of amplifiers are connected to each row line to apply a reference voltage to each resistive memory device to cause the amplifiers to operate at a different region in order to improve linearity and to obtain a better signal-to-noise ratio and improved noise margins.

The resistive memory devices also receive a number of programming signals. The programming signals define a number of values within a matrix. The resistive memory devices also receive a number of vector signals at the resistive memory devices, the vector signals representing a number of vector values to be applied to the resistive memory devices. A current collection line is coupled to the output of each column line to collect all currents output from the resistive memory devices through their respective column lines. The collected current equals a dot product of the matrix values and vector values.

As used in the present specification and in the appended claims, the term "dot product" is meant to be understood broadly as the product of two vectors to form a scalar, whose value is the product of the magnitudes of the vectors and the cosine of the angle between them. In one example, the vectors may be represented as matrices that may be multiplied to obtain the dot product. Other conventional names for dot product include scalar product and inner product. A dot product calculation is a computationally expensive task for a digital computer. This may be especially true when the matrices are not sparse or symmetric, such as in the case of dense matrices. A symmetric matrix is a square matrix that is equal to its transpose. Sparse matrices are matrices in which most of the elements are zero. In contrast, if most of the elements in the matrix are nonzero, then the matrix is considered dense.

Even still further, as used in the present specification and in the appended claims, the term "a number of" or similar language is meant to be understood broadly as any positive number including 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Turning now to the figures, FIG. 1 is a diagram of a computing system (100) for determining a dot product, according to one example of the principles described herein. The computing system (100) may be implemented in an electronic device. Examples of electronic devices include servers, desktop computers, laptop computers, personal digital assistants (PDAs), mobile devices, smartphones, gaming systems, and tablets, among other electronic devices.

The computing system (100) may be utilized in any data processing scenario including, stand-alone hardware, mobile applications, through a computing network, or combinations thereof. Further, the computing system (100) may be used in a computing network, a public cloud network, a private cloud network, a hybrid cloud network, other forms of networks, or combinations thereof. In one example, the methods provided by the computing system (100) are provided as a service over a network by, for example, a third party. In this example, the service may include, for example, the following: a Software as a Service (SaaS) hosting a number of applications; a Platform as a Service (PaaS) hosting a computing platform including, for example, operating systems, hardware, and storage, among others; an Infrastructure as a Service (IaaS) hosting equipment such as, for example, servers, storage components, network, and components, among others; application program interface (API) as a service (APIaaS), other forms of network services, or combinations thereof. The present systems may be implemented on one or multiple hardware platforms, in which the modules in the system can be executed on one or across multiple platforms. Such modules can run on various forms of cloud technologies and hybrid cloud technologies or offered as a SaaS (Software as a service) that can be implemented on or off the cloud. In another example, the methods provided by the computing system (100) are executed by a local administrator.

To achieve its desired functionality, the computing system (100) including various hardware components. Among these hardware components may be a number of processors (101), a number of data storage devices (102), a number of peripheral device adapters (103), and a number of network adapters (104). These hardware components may be interconnected through the use of a number of busses and/or network connections. In one example, the processor (101), data storage device (102), peripheral device adapters (103), and a network adapter (104) may be communicatively coupled via a bus (105).

The processor (101) may include the hardware architecture to retrieve executable code from the data storage device (102) and execute the executable code. The executable code may, when executed by the processor (101), cause the processor (101) to implement at least the functionality of applying a number of first voltages to a corresponding number of row lines within a memristive cross-bar array to change the resistive values of a corresponding number of memristors located at junctions between the row lines and a number of column lines, the first voltages representing a corresponding number of values within a matrix, respectively. The executable code may, when executed by the processor (101), also cause the processor (101) to implement at least the functionality of applying a number of second voltages to a corresponding number of row lines within a memristive cross-bar array, the second voltages representing a corresponding number of vector values. The executable code may, when executed by the processor (101), further cause the processor (101) to implement at least the functionality of collecting the output currents from the column lines, the collected output currents representing the dot product. The functionality of the computing system (100) is in accordance to the methods of the present specification described herein. In the course of executing code, the processor (101) may receive input from and provide output to a number of the remaining hardware units.

The data storage device (102) may store data such as executable program code that is executed by the processor (101) or other processing device. As will be discussed, the data storage device (102) may specifically store computer code representing a number of applications that the processor (101) executes to implement at least the functionality described herein.

The data storage device (102) may include various types of memory modules, including volatile and nonvolatile memory. For example, the data storage device (102) of the present example includes Random Access Memory (RAM) (106), Read Only Memory (ROM) (107), and Hard Disk Drive (HDD) memory (108). Many other types of memory may also be utilized, and the present specification contemplates the use of many varying type(s) of memory in the data storage device (102) as may suit a particular application of the principles described herein. In certain examples, different types of memory in the data storage device (102) may be used for different data storage needs. For example, in certain examples the processor (101) may boot from Read Only Memory (ROM) (107), maintain nonvolatile storage in the Hard Disk Drive (HDD) memory (108), and execute program code stored in Random Access Memory (RAM) (106).

The data storage device (102) may include a computer readable medium, a computer readable storage medium, or a non-transitory computer readable medium, among others. For example, the data storage device (102) may be, but not limited to, an electronic, magnetic, optical, electromagnetic, infrared, or semiconductor system, apparatus, or device, or any suitable combination of the foregoing. More specific examples of the computer readable storage medium may include, for example, the following: an electrical connection having a number of wires, a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store computer usable program code for use by or in connection with an instruction execution system, apparatus, or device. In another example, a computer readable storage medium may be any non-transitory medium that can contain, or store a program for use by or in connection with an instruction execution system, apparatus, or device.

The hardware adapters (103, 104) in the computing system (100) enable the processor (101) to interface with various other hardware elements, external and internal to the computing system (100). For example, the peripheral device adapters (103) may provide an interface to input/output devices, such as, for example, display device (109), a mouse, or a keyboard. The peripheral device adapters (103) may also provide access to other external devices such as an external storage device, a number of network devices such as, for example, servers, switches, and routers, client devices, other types of computing devices, and combinations thereof.

The display device (109) may be provided to allow a user of the computing system (100) to interact with and implement the functionality of the computing system (100). The peripheral device adapters (103) may also create an interface between the processor (101) and the display device (109), a printer, or other media output devices. The network adapter (104) may provide an interface to other computing devices within, for example, a network, thereby enabling the transmission of data between the computing system (100) and other devices located within the network.

The computing system (100) may, when executed by the processor (101), display the number of graphical user interfaces (GUIs) on the display device (109) associated with the executable program code representing the number of applications stored on the data storage device (102). The GUIs may display, for example, interactive screenshots that allow a user to interact with the computing system (100) to input matrix and vector values in association with a differential mode dot product engine (DPE) memristor array (110) as will be described in more detail below. Additionally, via making a number of interactive gestures on the GUIs of the display device (109), a user may obtain a dot product value based on the input data. Examples of display devices (109) include a computer screen, a laptop screen, a mobile device screen, a personal digital assistant (PDA) screen, and a tablet screen, among other display devices (106).

The computing system (100) may further include a differential mode dot product engine (DPE) memristive array (110). As will be described in more detail below, the differential mode DPE memristive array (110) includes a number of elements including a number of memristors that function together within an array to perform a weighted sum of multiple inputs. The differential mode DPE memristive array (110) may be used in a number of applications. For example, the differential mode DPE memristive array (110) may be used as a threshold logic gate (TLG) to perform a matrix product to compare the output with a threshold. Thus, the differential mode DPE memristive array (110) may be used as an accelerator in which the differential mode DPE memristive array (110) performs a number of functions faster than is possible in software running on a more general-purpose processing device. Although the differential mode DPE memristive array (110) is depicted as being a device internal to the computing system (100), in another example, the differential mode DPE memristive array (110) may be a peripheral device coupled to the computing system (100) or included within a peripheral device coupled to the computing system (100).

The computing system (100) further includes a number of modules used in the implementation of the systems and methods described herein. The various modules within the computing system (100) include executable program code that may be executed separately. In this example, the various modules may be stored as separate computer program products. In another example, the various modules within the computing system (100) may be combined within a number of computer program products; each computer program product includes a number of the modules.

The computing system (100) may include a dot product engine module (111) to, when executed by the processor (101), assist in the functionality of the differential mode DPE memristive array (110). The dot product engine module (111), for example, receives a number of input values defining a matrix to be processed in a dot product mathematical calculation. The dot product engine module (111) may send the input values to the differential mode DPE memristive array (110) as programming signals to a number of memristors within the differential mode DPE memristive array (110) to program the memristors. The dot product engine module (111) may also receive a vector input to be processed in connection with the matrix programmed into the memristors. The dot product engine module (111) may further obtain a value representing the dot product, and convey that value as data to the computing system (100) or another computing device for analysis or further processing.

Figure 2:
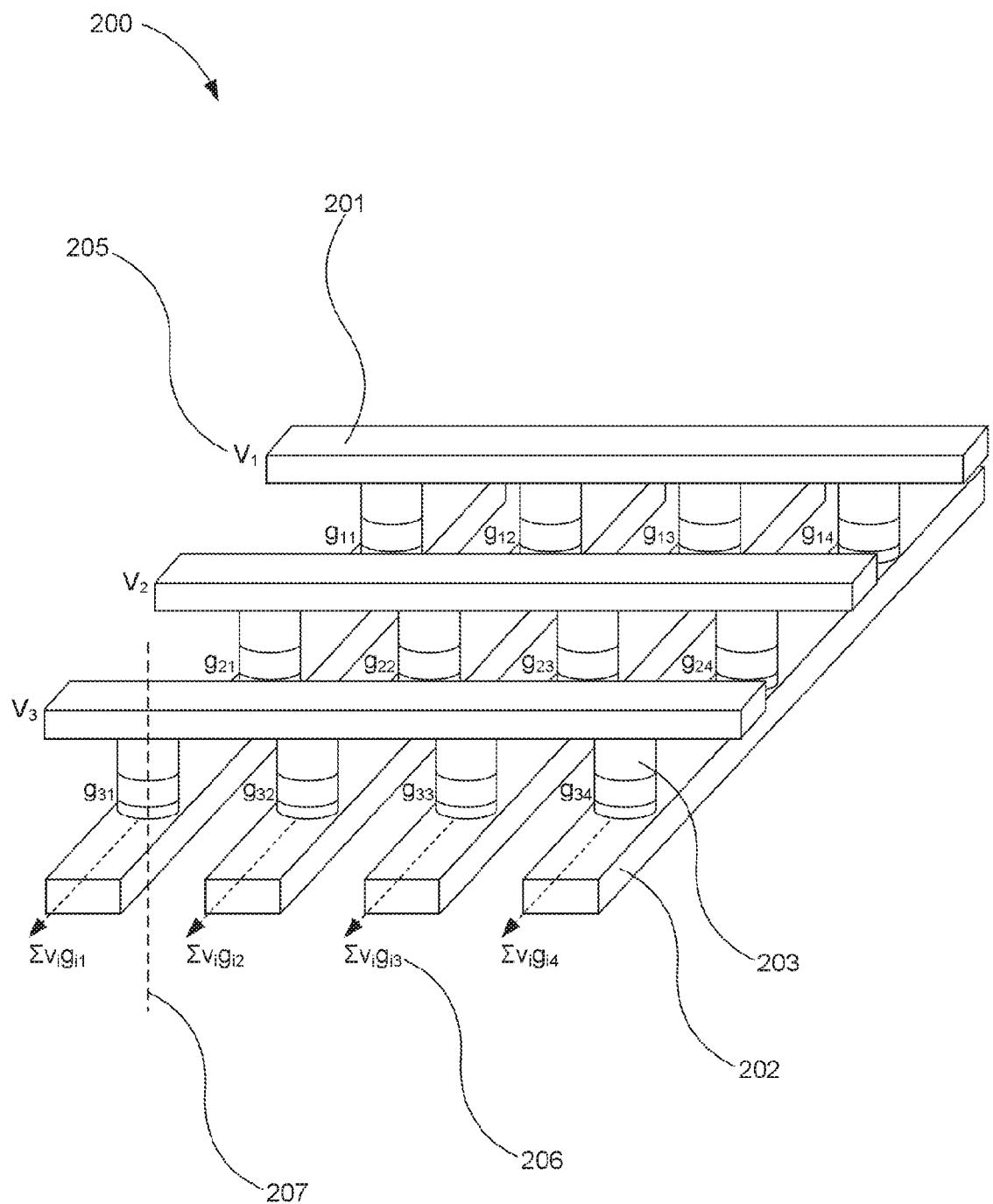
FIG. 2 is a diagram of a memristive cross-bar array used within the differential mode dot product engine (DPE) memristor array of the computing system of FIG. 1, according to one example of the principles described herein.

FIG. 2 is a diagram of a memristive cross-bar array (200) used within the differential mode dot product engine (DPE) memristor array (110) of the computing system (100) of FIG. 1, according to one example of the principles described herein. The memristive cross-bar array (200) may include a number of electrically conductive row lines (201) and a number of electrically conductive column lines (202). Even though three row lines (201) and four column lines (202) are depicted in FIG. 2, any number of row lines (201) and column lines (202) may be present in the memristive cross-bar array (200). The row lines (201) and column lines (202) intersect at junctions as indicated by the dashed line (207). A number of resistive memory devices or "memristors" (203) are located at the junctions (207) and electrically couple the row lines (201) to the column lines (202).

Memristance is a property of the electronic component referred to as a memristor. If charge flows in one direction through a circuit, the resistance of that component of the circuit will increase. If charge flows in the opposite direction in the circuit, the resistance will decrease. If the flow of charge is stopped by turning off the applied voltage, the component will "remember" the last resistance that it had, and when the flow of charge starts again the resistance of the circuit will be what it was when it was last active. A memristor is a resistor device whose resistance can be changed.

The conductance channels in the memristors (203) may be formed in each of the memristors (203) and the memristors (203) may be individually addressed as bits. A cross-bar is an array of switches that connect each wire in one set of parallel wires (201) to every member of a second set of parallel wires (202) that intersects the first set (201). In the example of FIG. 2, the row lines (201) and the column lines (202) are perpendicular with respect to each other, but the row lines (201) and the column lines (202) may intersect at any angle.

The memristors (203) may be built at the micro- or nano-scale and used as a component in a wide variety of electronic circuits, such as, bases for memories and logic circuits. When used as a basis for memories, the memristors (203) may be used to store a bit of information, 1 or 0. When used as a logic circuit, as described herein, the memristors (203) may be employed to represent bits in a field programmable gate array, as the basis for a wired-logic programmable logic array, or, as described herein, as a dot product engine. The memristors (203) disclosed herein may also find use in a wide variety of other applications. The memristors (203) may be fabricated through any reasonably suitable fabrication process, such as, for example, chemical vapor deposition, sputtering, etching, lithography, or other methods of forming memristors.

The memristive cross-bar array (200) of FIG. 2 further includes a number of input values (205) indicated as $V_1$, $V_2$, and $V_3$. The input values (205) may be program signals used to change the resistance values at each individual memristor (203) at each junction in the cross-bar array to create a representation (e.g., a mapping) of a mathematic matrix in which each value at each junction represents a value within the matrix. This change in resistance among the individual memristors (203) is an analog change from a low-to-high value or a high-to-low value. In this manner, the memristors are "memory resistors" in that they "remember" the last resistance that they had.

The input values (205) may also be read signals used to read the resistance values at each individual memristor (203) at each junction in the cross-bar array, and, as will now be described, as a way to multiply a matrix value by a vector value at each memristor (203) involved in the calculation. The read signals referred to herein as a vector signals may be applied as second input values (205) to the row lines (201) of the memristive cross-bar array (200). The vector signals may represent a vector to be multiplied to the matrix represented by the program signals. In one example, the vector signals have a relatively lower voltage value than the first voltages used to program the memristors (203) such that the voltage level applied by the vector signals does not change the resistance values of the memristors (203) as programmed by the first voltages. The vector signals act as read signals in this manner by not changing the resistance values of the memristors (203).

The vector signals interact with the memristors (203) at their respective junctions (207), and the resulting current is collected at the end of each column line (202) at 206. The sum of each column line (202) is represented by $\Sigma v_i g_{i1}$, $\Sigma v_i g_{i2}$, $\Sigma v_i g_{i3}$, and $\Sigma v_i g_{i4}$ as indicated in FIG. 2 where $g_{i1-4}$ are the memristor (203) conductance values. The sums obtained from the voltage values represent the values of a column vector. These sums of each column line (202) may also be summed at a current collection line (311) through a conversion circuit (313) to obtain a single value of $$\sum_{i=1}^{m} Iout_i$$

depicted in FIG. 3 and as will be described in more detail below. In one example, an initial signal may be applied to the memristors (203) before application of the program signals and the vector signals in order to set the resistivity of the memristors (203) to a known value.

Figure 3:
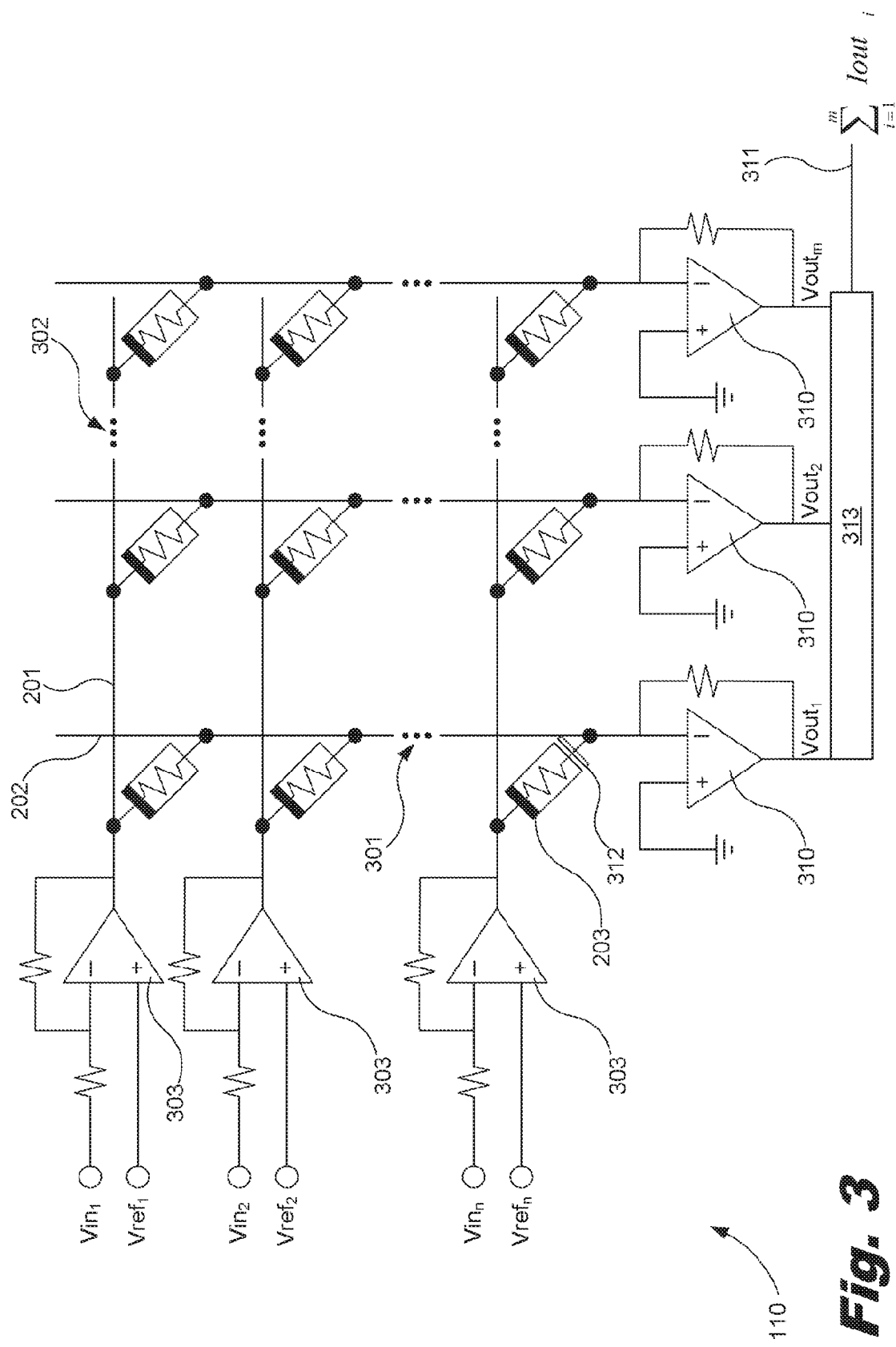
FIG. 3 is a circuit diagram of the differential mode dot product engine (DPE) memristor array of FIGS. 1 and 2, according to one example of the principles described herein.

FIG. 3 is a circuit diagram (300) of the differential mode DPE memristive array (110) of FIGS. 1 and 2, according to one example of the principles described herein. Although the differential mode DPE memristive array (110) of FIG. 3 is depicted as having a circuit layout as depicted, any number of circuit layouts may be used to achieve the function of the present systems and methods. The differential mode DPE memristive array (110) as depicted in FIG. 3 includes the row lines (201), the column lines (202), and the memristors (203) as described above in connection with FIG. 2. As mentioned above, any number of row lines (201) and column lines (202) may be included within the differential mode DPE memristive array (110) as indicated by the ellipses (301, 302). In one example, the number of row lines (201) and column lines (202) included within the differential mode DPE memristive array (110) may be equal or greater than the size of the matrix of the dot product to be calculated using the systems and methods described herein.

The differential mode DPE memristive array (110) may further include a number of differential input circuits such as, for example, operational amplifiers (op amps) (303) at the input terminals of the row lines (201). Although the op amps (303) are depicted in FIG. 3, any type of differential input circuit may be used. The op amps (303) are designed with negative feedback that subtracts a fraction of the output of the op amps (303) from the input in order to improve gain stability, linearity, frequency response, and step response, and reduce sensitivity to parameter variations due to manufacturing or the environment. An input voltages ($Vin_1$, $Vin_2$, ..., $Vin_n$) and reference voltages ($Vref_1$, $Vref_2$, ..., $Vref_n$) may be applied to the op amps (303) as described herein to obtain a dot product value.

The op amps (303) are also designed to be differential amplifiers in order to make the DPE memristive array (110) a differential mode DPE memristive array (110). For each output of a DPE memristive array (110), the following relationship exists:

$$V_{output} = -R_f \sum V_{input\_i} \times \frac{1}{R_i} \qquad \text{Eq. 1}$$

where $R_f$ is the op amp (303) feedback resistance and $R_i$ is the memristor multi-level analog resistance predefined before calculation of a dot product.

Figure 4:
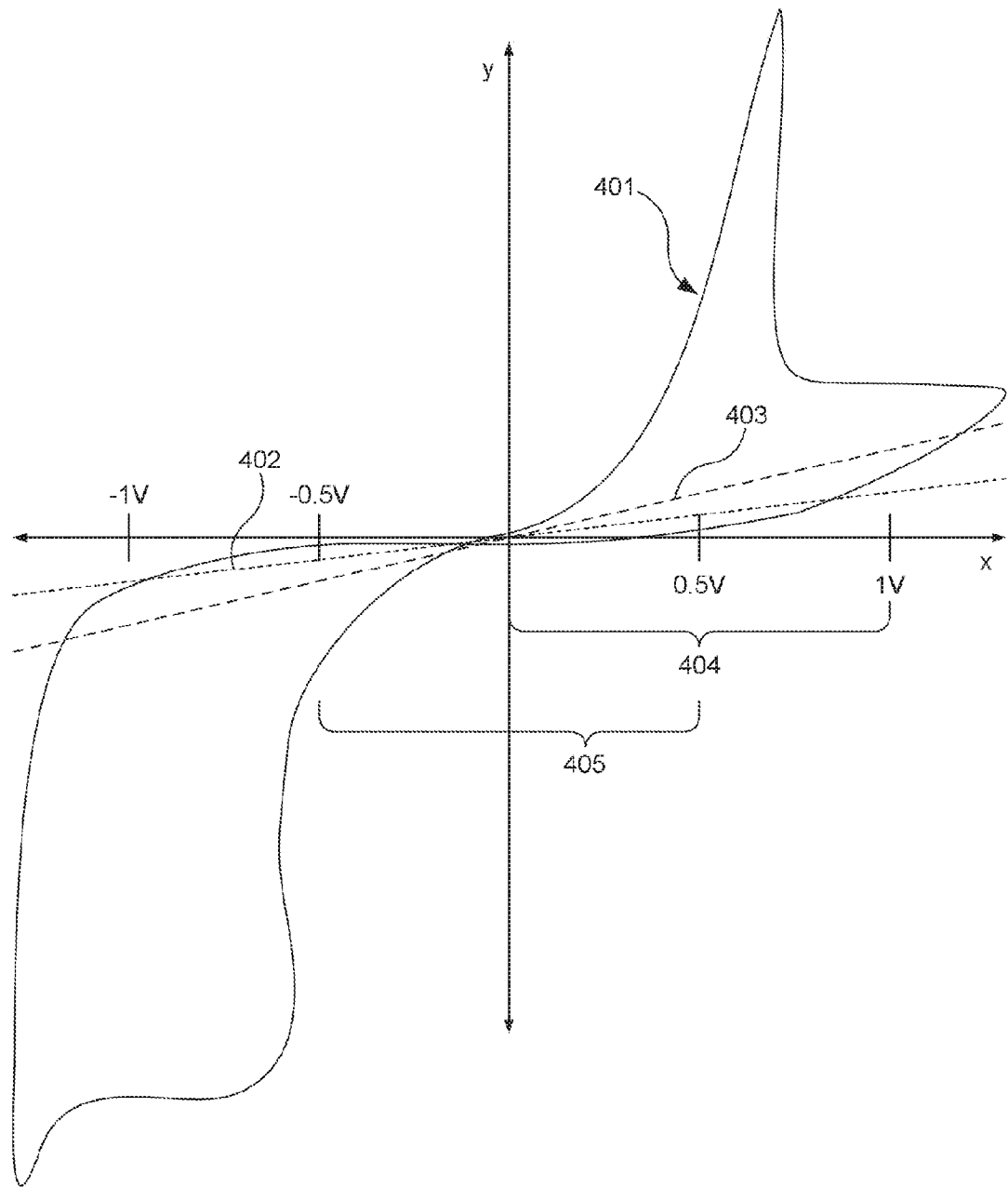
FIG. 4 is a graph of the function of the memristive devices of FIG. 3 depicting a current versus voltage loop of the memristors, according to one example of the principles described herein.

Memristors (203) are analog devices that have higher non-linearity at larger voltages. Memristors (203) will have better linearity during small signals. For example, operating the memristor in the region of [0V, 1V] (FIG. 4, 404) will give higher non-linearity as compared to operating the memristors (203) in the [−½V, ½V] region (FIG. 4, 405). This is illustrated by FIG. 4.

FIG. 4 is a graph of the function of the memristive devices (203) of FIG. 3 depicting a current versus voltage loop of the memristors, according to one example of the principles described herein. As depicted in FIG. 4, the x-axis represents the voltage value seen by the memristor (203), and the y-axis represents the current value as seen by the memristor (203). The functions, curves, and values depicted in FIG. 4 are examples only, and are not intended to indicate any specific value. In some examples, the current versus voltage loop of FIG. 4 may be depicted as a pinched hysteresis curve. As depicted in FIG. 4, the memristor (203) current/voltage loop (401) is much more linear in the [−½V, ½V] region (405) as indicated by the first line (402) as opposed to relative non-linearity depicted in the region of [0V, 1V] (404) as indicated by the second line (403).

The term negative resistance refers to negative differential resistance (NDR), where $$\frac{\Delta v}{\Delta i} < 0.$$

NDR may be one of a number of causes for non-linearity. The region of [0V, 1V] (404) may be referred to as a large signal operation region. The memristors (203) may be more nonlinear within the region of [0V, 1V] (404), but may be classified as ohmic in the [−½V, ½V] region (405). Because they are nonlinear, negative resistance devices have a more complicated behavior than the positive ohmic resistances usually encountered in electric circuits.

For applications of a dot product engine (DPE) memristor array, a linear current/voltage behavior of the memristors (203) reduces output errors. A common mode DPE memristor array is used in various one resistor (0T1R) circuit architecture, one transistor-one resistor (1T1R) circuit architecture, and one switch-one resistor (1S1R) circuit architecture. However, memristors (203) exhibit non-linear behavior. In contrast, a differential mode DPE design proposed herein provides better performance with regard to linearity.

Thus, in order to shift the operation region of the ops amps (303), the reference voltage indicated as $Vref_1$, $Vref_2$, ..., $Vref_n$ in FIG. 3 may be used to differentiate the input. In one example, the value of $V_{ref}$ for a given op amp (303) is chosen to be half of a maximum voltage input at $V_{in}$ ($V_n$ max). This will shift the operation region of the large signal [0, V] to a small signal [−½V, ½V]. With this differential shift, better accuracy is achieved with improved linearity and a better signal-to-noise ratio and improved noise margins are obtained. Mathematically, nonlinearity may be indicated by a 1st order differential of dV/dI. A 2nd order differential defines a trend. Assuming a fixed differential, and a large range such as 2*dI or 2*dV, this will lead to a larger value.

Further, the Vout, as will be described in more detail below, may be re-mapped easily to a desired positive integer value. The differential mode DPE memristive array (110) will work satisfactorily even when the values of all $Vin_1$, $Vin_2$, ..., $Vin_n$ are −½V.

The differential mode DPE memristive array (110) may further include a number of current amplifiers (310) to convert the current received from the memristors (203) along the column lines (202) into respective output voltages ($Vout_1$, $Vout_2$, $Vout_m$). In one example, the current amplifiers (310) are transimpedance amplifiers (TIAs). A TIA is a current to voltage converter, implemented using an operational amplifier as depicted in FIG. 3. The TIA is used to amplify the current output of the differential mode DPE memristive array (110) to a usable voltage.

The currents from the column lines (202) may be collected using a collection line (311). The collected currents $$\left(\sum_{i=1}^{m} Iout_i\right)$$

represent the dot product of the matrix values and vector values. As depicted in FIG. 3, a conversion circuit (313) may be placed between the current amplifiers (310) and the collection line (311). If the voltages output from the current amplifiers (310) are collected, all the voltages will be forced to be equal under Kirchhoff's voltage law, and the value for the dot product would be lost. Thus, the current obtained from the memristors (203) are summed. In one example, the current amplifiers (310) may be removed to allow the collection of current as opposed to the voltages output by the current amplifiers (310). In another example and as depicted in FIG. 3, the conversion circuit (313) collects the voltages output from the individual current amplifiers (310), convert the voltages into current, and sums the current. However, any circuit design may be used to obtain a sum of the currents from the memristors (203) to obtain the dot product.

Although the differential mode DPE memristive array (110) of FIG. 3 is depicted as including the op amps (303) and transimpedance amplifiers (310), any number of circuit layouts may be used to achieve the function of the present systems and methods as described herein.

The differential mode DPE memristive array (110) may further include a number of selectors (312). In some instances, sneak path currents may occur within the differential mode DPE memristive array (110) during the application of a programming signal. Sneak path currents are unintended electrical current paths within a circuit. In the example of the present differential mode DPE memristive array (110), sneak path currents may effect a number of neighboring memristors (203) when a target memristor is being programmed or read as described above in connection with blocks 501 and 502 of FIG. 5. In one example, when a voltage is applied to a target memristor (203), neighboring memristors (203) may see a portion of that voltage via the sneak path currents flowing within the differential mode DPE memristive array (110). The sneak path currents cause the neighboring memristors (203) to be unintentionally and incorrectly programmed or otherwise improperly utilized.

In one example, a number of selectors (312) may be included within the differential mode DPE memristive array (110). The selectors may be placed in series with each memristor (203) at each junction (207) as depicted in FIG. 3. Although one selector (302) is depicted in FIG. 3 to provide for clarity within the figure, any number of selectors (312) may be placed in series with each of the memristors (302). A selector is any circuit element that screens the memristors (203) from sneak current paths to ensure that only the selected bits represented by the memristors (203) are read or programmed. Selectors are sometimes referred to as multiplexers (mux). In this manner, the current may be focused on the target memristor (203) without affecting the neighboring memristors (203). As depicted in FIG. 3, the memristor (203) and selector (312) may form a one selector-one memristor (1S1M) circuit architecture, a one selector-one resistor (1S1R) circuit architecture, a one transistor-one resistor (1T1R) (a transistor being used in place of a selector) circuit architecture, or a one resistor (0T1R) circuit architecture as described above.

Figure 5:
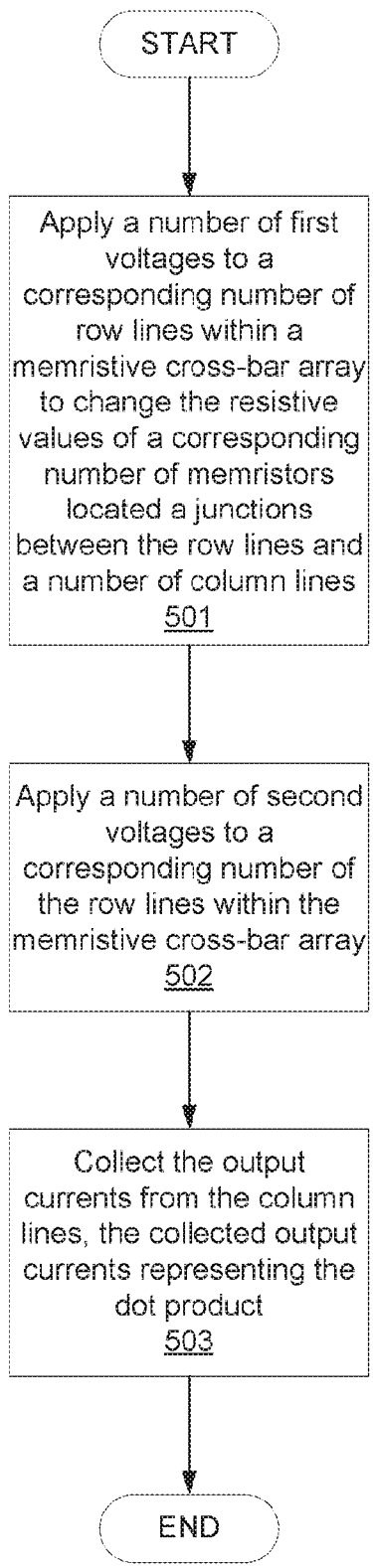
FIG. 5 is a flowchart showing a method of operation of the differential mode DPE memristive array of FIGS. 1 and 3, according to one example of the principles described herein.

FIG. 5 is a flowchart showing a method of operation of the differential mode DPE memristive array (110) of FIGS. 1 and 3, according to one example of the principles described herein. The method of FIG. 5 may begin by applying (block 501) a number of first voltages to a corresponding number of row lines (201) within a memristive cross-bar array to change the resistive values of a corresponding number of memristors (203) located a junctions (207) between the row lines (201) and the column lines (202). The first voltages are the program voltages described above that represent a corresponding number of values within a matrix, respectively. In this manner, a mathematical matrix is mapped to the differential mode DPE memristive array (110), and is ready to be processed as a first set of values in a dot product mathematical process.

In one example, two or more differential mode DPE memristive array(s) (110) or a differential mode DPE memristive array(s) (110) with double the width and length may be used to represent a mathematical matrix with negative values. In this example, the two or more differential mode DPE memristive array(s) (110) or a differential mode DPE memristive array(s) (110) with double the width and length may be coupled to the computing system (100) as described above.

The method of FIG. 5 may continue by applying (block 502) a number of second voltages to a corresponding number of row lines (201) within the differential mode DPE memristive array (110). The second voltages represent a number of vector values to be applied to the matrix values programmed into the memristors (203) to obtain a dot product of the matrix values and the vector values. When the second voltages are applied to the memristors (203) of the differential mode DPE memristive array (110), the memristors (203) see a voltage input ($Vin_1, Vin_2, \ldots, Vin_n$) that causes a current to run through the memristor (203). The current level running through the memristor (203) is the value of the voltage input ($Vin_1, Vin_2, \ldots, Vin_n$) multiplied by the conductance of the memristor (203), the conductance of the memristor being defined by the first voltage that changed the resistive value of the memristor (203). The vector signals act as read signals. The voltage level applied by the vector signals is relatively smaller than the first voltages used to program the memristors (203) such that the voltage level applied by the vector signals does not change the resistance values of the memristors (203) as programmed by the first voltages.

In this manner, the current obtained from the individual memristors (203) through the application of the second voltages is equal to the multiplication of the matrix value obtained by the program signals at the respective memristor (203) with the vector values obtained by the vector signals at the respective memristor (203).

The method of FIG. 5 may continue by collecting (block 503) the output currents from the column lines (202), the collected output currents representing the dot product. As depicted in FIG. 3, output currents of the memristors (203) as collected by the column lines (202) may be further collected using the collection line (311). The differential mode DPE memristive array (110) of FIG. 3 is depicted as including the transimpedance amplifiers (310) to convert the current output by the memristors (203) into respective output voltages ($Vout_1, Vout_2, Vout_m$). However, any circuit topology or design may be utilized to obtain a desired value. The collected signals obtained from the collection line (311) such as the collected current $$\left(\sum_{i=1}^{m} Iout_i\right)$$

represent the dot product of the matrix values and vector values.

In order to represent a new mathematical matrix and vector, the process of FIG. 5 may loop back to block 501 in which a number of new first voltages are applied (block 601) to a corresponding number of row lines (201) within the differential mode DPE memristive array (110) to change the resistive values of a corresponding number of memristors (203). In this manner, new resistive values are programmed into the memristors (203) of the memristive cross-bar array that represent the new mathematical matrix. The method may continue to blocks 502 and 503 as described above by applying (502) new second voltages to a corresponding number of row lines (201) within the differential mode DPE memristive array (110) that represent a corresponding number of new vector values to be applied to the matrix values programmed into the memristors (203).

Throughout the present systems and methods, voltages and currents are described as being collected at the ends of column lines (202) and further collected using the collection line (311). However, any circuit topology or design may be utilized to obtain a desired output such as a voltage value, a current value or other circuit parameter.

Aspects of the present system and method are described herein with reference to flowchart illustrations and/or block diagrams of methods, apparatus (systems) and computer program products according to examples of the principles described herein. Each block of the flowchart illustrations and block diagrams, and combinations of blocks in the flowchart illustrations and block diagrams, may be implemented by computer usable program code. The computer usable program code may be provided to a processor of a general purpose computer, special purpose computer, or other programmable data processing apparatus to produce a machine, such that the computer usable program code, when executed via, for example, the processor (101) of the computing system (100) or other programmable data processing apparatus, implement the functions or acts specified in the flowchart and/or block diagram block or blocks. In one example, the computer usable program code may be embodied within a computer readable storage medium; the computer readable storage medium being part of the computer program product. In one example, the computer readable storage medium is a non-transitory computer readable medium.

The specification and figures describe a computing device and associated methods for determining a dot product. The computing device includes a processor, and memristor cross-bar array coupled to the processor. The memristor cross-bar array includes a number of row lines, a number of column lines intersecting the row lines to form a number of junctions, and a number of memristor devices coupled between the row lines and the column lines at the junctions. The memristor devices receive a number of programming signals at the memristor devices. The programming signals define a number of values within a matrix. The memristor devices also receive a number of vector signals at the memristor devices. The vector signals define a number of vector values to be applied to the memristor devices. The memristor cross-bar array further includes a number of amplifiers connected to each row line to apply a reference voltage to each resistive memory device to set the resistive memory devices to an initial resistance. The amplifiers shift the operation region of the memristive cross-bar array based on the ratio of a voltage of a voltage input into the amplifiers and a voltage of a reference voltage input into the amplifiers.

This restive cross-bar array for determining a dot product may have a number of advantages, including: (1) faster processing and more energy efficient of a dot product calculation relative to other DPEs that do not use memristive devices; (2) operation of the DPE in a differential mode that provides for the memristors to operate in a more linear region and provide better signal-to-noise ratio and noise margins; (3) the shifting of the operation region from a large signal ([0V, 1V]) to a small signal ([−½V, ½V]) will reduce the risk of switching the memristor accidently, resulting in a reduction of output errors; (4) the reduced operation voltage will also lead to less impact to the memristor devices by way of electrical stress, which will increase the device endurance; and (5) provides a design that is compatible with multiple schemes including 0T1R, 1T1R and 1S1R, among other advantages.

The preceding description has been presented to illustrate and describe examples of the principles described. This description is not intended to be exhaustive or to limit these principles to any precise form disclosed. Many modifications and variations are possible in light of the above teaching.

What is claimed is:

1. A memristive cross-bar array for determining a dot product, comprising:
    a plurality of row lines;
    a plurality of column lines intersecting the row lines to form respective junctions;
    a plurality of resistive memory elements coupled between the row lines and the column lines at the junctions,
        the row lines to provide programming signals to the resistive memory elements, the programming signals defining matrix values within a matrix of the resistive memory elements; and
        the row lines to provide vector signals at the resistive memory elements, the vector signals defining vector values to be applied to the resistive memory elements;
    a current collection line to collect all currents output from the resistive memory elements through the respective column lines, the collected currents equaling a dot product of the matrix values and the vector values; and
    circuits connected to the row lines to apply a reference voltage to shift an operation region of the memristive cross-bar array based on the reference voltage.

2. The memristive cross-bar array of claim 1, wherein the shift of the operation region is based on a ratio of a voltage of an input voltage into the circuits and a voltage of the reference voltage input into the circuits.

3. The memristive cross-bar array of claim 2, wherein the ratio comprises voltages such that the reference voltage is equal to a maximum voltage of the input voltage divided by two.

4. The memristive cross-bar array of claim 1, wherein the circuits comprise negative feedback operational amplifiers.

5. The memristive cross-bar array of claim 1, wherein a calculation of all sums and products of the dot product are performed simultaneously by the memristive cross-bar array.

6. The memristive cross-bar array of claim 1, wherein the memristive cross-bar array is used as an accelerator in connection with a computer program such that an output of the memristive cross-bar array is coupled to a processing device as input for the computer program.

7. The memristive cross-bar array of claim 1, wherein a first programming signal of the programming signals is provided over a first row line of the row lines, and a first vector signal of the vector signals is provided over the first row line, wherein the first programming signal is set to a voltage to change a resistance of a first resistive memory element of the memristive cross-bar array, and the first vector signal is set to a voltage lower than the voltage of the first programming signal such that the first vector signal does not change the resistance of the first resistive memory element.

8. The memristive cross-bar array of claim 4, wherein each respective negative feedback operational amplifier of the negative feedback operational amplifiers has a first input connected to a respective row line of the row lines, and a second input connected to the reference voltage.

9. The memristive cross-bar array of claim 8, wherein the first input is a negative input of the negative feedback operational amplifier, and the second input is a positive input of the negative feedback operational amplifier.

10. The memristive cross-bar array of claim 1, wherein the circuits comprise differential amplifiers, wherein each respective differential amplifier of the differential amplifiers has a first input connected to a respective row line of the row lines, and a second input connected to the reference voltage.

11. A method of obtaining a dot product, comprising:
applying first voltage signals to corresponding row lines within a memristive cross-bar array to change resistive values of corresponding memristors located at junctions between the row lines and column lines, the first voltage signals defining matrix values within a matrix of the memristors;
applying second voltage signals to the row lines within the memristive cross-bar array, the second voltage signals defining corresponding vector values;
collecting output currents from the column lines, the collected output currents defining the dot product; and
shifting an operation region of the memristive cross-bar array using differential amplifiers connected to the row lines, based on application of a reference voltage to the differential amplifiers.

12. The method of claim 11, further comprising applying an initial voltage to each memristor to set the memristors to an initial resistance.

13. The method of claim 11, wherein the differential amplifiers are negative feedback operational amplifiers.

14. The method of claim 11, wherein the shifting of the operation region is based on a ratio of a voltage value of an input voltage into the differential amplifiers and the reference voltage.

15. The method of claim 14, wherein the ratio comprises voltages such that the reference voltage is equal to a maximum voltage of the input voltage divided by two.

16. The method of claim 11, wherein each respective differential amplifier of the differential amplifiers has a first input connected to a respective row line of the row lines, and a second input connected to the reference voltage.

17. A computing device comprising:
a processor; and
a memristor cross-bar array coupled to the processor, the memristor cross-bar array comprising:
a plurality of row lines;
a plurality of column lines intersecting the row lines to form respective junctions;
a plurality of memristor devices coupled between the row lines and the column lines at the junctions,
the row lines to provide programming signals at the memristor devices, the programming signals defining matrix values within a matrix of the memristor devices; and
the row lines to provide vector signals at the memristor devices, the vector signals defining vector values to be applied to the memristor devices; and
a plurality of circuits connected to the row lines to apply a reference voltage to each memristor device to set the memristor devices to an initial resistance,
wherein the circuits are to shift an operation region of the memristive cross-bar array based on a ratio of a voltage of a voltage input into the circuits and the reference voltage.

18. The computing device of claim 17, wherein the memristor cross-bar array further comprises a current collection line to collect all currents output from the memristor devices through the respective column lines, the collected current equaling a dot product of the matrix values and the vector values.

19. The computing device of claim 17, wherein the processor is to input an output of the memristor cross-bar array to a computer program.

* * * * *